(12) United States Patent
Bochiechio et al.

(10) Patent No.: US 10,597,329 B2
(45) Date of Patent: *Mar. 24, 2020

(54) THERMAL BARRIER COATING FOR CMAS RESISTANCE AND LOW THERMAL CONDUCTIVITY

(71) Applicant: United Technologies Corporation, Farmington, CT (US)

(72) Inventors: Mario P. Bochiechio, Vernon, CT (US); David A. Litton, West Hartford, CT (US); Michael J. Maloney, Marlborough, CT (US)

(73) Assignee: United Technologies Corporation, Farmington, CT (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/298,204

(22) Filed: Mar. 11, 2019

(65) Prior Publication Data

US 2019/0202741 A1    Jul. 4, 2019

Related U.S. Application Data

(62) Division of application No. 14/762,011, filed as application No. PCT/US2013/022366 on Jan. 21, 2013, now Pat. No. 10,227,262.

(51) Int. Cl.
*C04B 35/488* (2006.01)
*C23C 16/44* (2006.01)
(Continued)

(52) U.S. Cl.
CPC .......... *C04B 35/4885* (2013.01); *C04B 35/50* (2013.01); *C04B 41/009* (2013.01); *C04B 41/5042* (2013.01); *C04B 41/52* (2013.01); *C04B 41/87* (2013.01); *C04B 41/89* (2013.01); *C23C 4/134* (2016.01); *C23C 14/22* (2013.01); *C23C 16/44* (2013.01); *C23C 28/042* (2013.01); *C23C 28/32* (2013.01); *C23C 28/321* (2013.01); *C23C 28/3215* (2013.01);
(Continued)

(58) Field of Classification Search
CPC ... C04B 35/4885; C04B 35/50; C04B 41/009; C04B 41/5042; C04B 41/52; C04B 41/87; C23C 4/134; C23C 14/22; C23C 16/44; C23C 28/042; C23C 28/32; C23C 28/321; F01D 5/284; F01D 5/288
See application file for complete search history.

(56) References Cited

U.S. PATENT DOCUMENTS 7,291,408 B2    11/2007    Litton et al.
7,785,722 B2    8/2010    Freling et al.
(Continued)

FOREIGN PATENT DOCUMENTS

EP    1806435 A2    7/2007

OTHER PUBLICATIONS

European Search Report for Application No. 13871821.8 dated Jul. 27, 2016.

*Primary Examiner* — John E Uselding
(74) *Attorney, Agent, or Firm* — Bachman & LaPointe, P.C.

(57) ABSTRACT

A thermal barrier coating for a turbine engine component contains neodymia, optionally alumina, and zirconia. The thermal barrier coating has resistance to CMAS attack and a low thermal conductivity.

4 Claims, 2 Drawing Sheets

(51) Int. Cl.
   *C23C 14/22*   (2006.01)
   *F01D 5/28*    (2006.01)
   *C23C 28/04*   (2006.01)
   *C23C 28/00*   (2006.01)
   *C04B 35/50*   (2006.01)
   *C04B 41/87*   (2006.01)
   *C04B 41/89*   (2006.01)
   *C04B 41/00*   (2006.01)
   *C04B 41/50*   (2006.01)
   *C04B 41/52*   (2006.01)
   *C23C 4/134*   (2016.01)

(52) U.S. Cl.
   CPC .......... *C23C 28/3455* (2013.01); *F01D 5/284* (2013.01); *F01D 5/288* (2013.01); *C04B 2235/3224* (2013.01); *F05D 2300/21* (2013.01)

(56) References Cited

U.S. PATENT DOCUMENTS

| | | | |
|---|---|---|---|
| 10,227,262 B2 * | 3/2019 | Bochiechio | ........... C23C 28/042 |
| 2007/0160859 A1 | 7/2007 | Darolia et al. | |
| 2009/0169752 A1 | 7/2009 | Fu et al. | |

* cited by examiner

THERMAL BARRIER COATING FOR CMAS RESISTANCE AND LOW THERMAL CONDUCTIVITY

CROSS-REFERENCE TO RELATED APPLICATION

The instant application is a divisional application of U.S. patent application Ser. No. 14/762,011, filed Jul. 20, 2015, which is a 371 of International Application PCT/US2013/022366, filed Jan. 21, 2013.

BACKGROUND

The present disclosure relates to a thermal barrier coating for use on a turbine engine component, which thermal barrier coating contains neodymia ($Nd_2O_3$), optionally alumina, and zirconia.

Thermal barrier coatings are materially systems applied to metallic surfaces, such as gas turbine components, which operate at elevated temperatures. These coatings serve to insulate components from large and prolonged heat loads by utilizing thermally insulating material which can sustain an appreciable temperature difference between the load-bearing alloys and the coating surface. In doing so, these coatings can allow for higher operating temperatures while limiting the thermal exposure of structural components, extending part life by reducing oxidation and thermal fatigue.

Thermal barrier coatings are often formed from 7% yttria stabilized zirconia (7YSZ). Such coatings may be subject to attack by infiltration of calcium-magnesium-alumina-silicate (CMAS) materials. CMAS attacks can alter the composition and fill the porosity in air plasma spray (APS) coatings or the columns in electron beam physical vapor deposition (EB-PVD) coatings. With thermal cycling, the CMAS may degrade the overall coating system and cause it to spall off of the substrate.

Thus, there is a need for new thermal barrier coatings which are capable of avoiding the foregoing problems.

SUMMARY

In accordance with the present disclosure, there is provided a thermal barrier coating which broadly comprises neodymia, optionally alumina, and zirconia.

In another and alternative embodiment, the thermal barrier coating consists of neodymia, optionally alumina, and zirconia.

In another and alternative embodiment, the thermal barrier coating consists of from 15 to 60 mol % neodymia, and the balance zirconia.

In another and alternative embodiment, the neodymia is present in an amount from 20 to 35 mol %.

In another and alternative embodiment, the thermal barrier coating consists of from 15-60 mol % neodymia, 2.0-40 mol % alumina, and the balance zirconia.

In another and alternative embodiment, the zirconia is present in an amount greater than 40 mol %.

In another and alternative embodiment, the neodymia is present in an amount from 20 to 35 mol %.

Further in accordance with the present invention, there is provided a process for forming a thermal barrier coating on a turbine engine component which process broadly comprises providing a substrate; and depositing on the substrate a thermal barrier coating containing neodymia, optionally alumina, and zirconia.

In another and alternative embodiment, the depositing step comprises forming a thermal barrier coating consisting of from 15 to 60 mol % neodymia, and the balance zirconia.

In another and alternative embodiment, the depositing step comprises forming a thermal barrier coating consisting of from 20 to 35 mol % and the balance zirconia.

In another and alternative embodiment, the depositing step comprises forming a thermal barrier coating consisting of from 15-60 mol % neodymia, 2.0-40 mol % alumina, and the balance zirconia.

In another and alternative embodiment, the zirconia is present in an amount greater than 40 mol %.

In another and alternative embodiment, the neodymia is present in an amount from 20 to 35 mol %.

In another and alternative embodiment, the substrate providing step comprises providing a substrate formed from one of a nickel-based alloy, a cobalt-based alloy, a titanium based alloy, a ceramic-matrix composite material and a ceramic material.

In another and alternative embodiment, the process further comprises forming a bond coat between the substrate and the thermal barrier coating.

Still further in accordance with the present disclosure, there is provided a part which broadly comprises a substrate; and a thermal barrier coating deposited on the substrate, which thermal barrier coating consists of neodymia, optionally alumina, and zirconia.

In another and alternative embodiment, the thermal barrier coating consists of from 15 to 60 mol % neodymia, and the balance zirconia.

In another and alternative embodiment, the neodymia is present in an amount from 20 to 35 mol %.

In another and alternative embodiment, the thermal barrier coating consists of from 15-60 mol % neodymia, 2.0-40 mol % alumina, and the balance zirconia.

In another and alternative embodiment, the zirconia is present in an amount greater than 40 mol %.

In another and alternative embodiment, the neodymia is present in an amount from 20 to 35 mol %.

In another and alternative embodiment, the part further comprises a bond coat deposited on the substrate.

In another and alternative embodiment, the part further comprises a ceramic layer positioned between the substrate and the thermal barrier coating layer.

In another and alternative embodiment, the ceramic layer comprises from 4.0 to 25.0 wt % yttria stabilized zirconia.

In another and alternative embodiment, the part further comprises an additional layer consisting of neodymia and zirconia positioned between the ceramic layer and the thermal barrier coating layer.

In another and alternative embodiment, the additional layer consists of from 15 to 60 mol % neodymia, and the balance zirconia.

In another and alternative embodiment, the neodymia in the additional layer is present in an amount from 20 to 35 mol %.

In another and alternative embodiment, the part further comprises an additional layer consisting of an oxide stabilized zirconia coating.

In another and alternative embodiment, the oxide stabilized zirconia coating comprises an oxide of La, Ce, Pr, Nd, Pm, Sm, Eu, Gd, Tb, Dy, Ho, Er, Tm, Yb, Lu, Mg, Ca, Hf, Sr, and combinations thereof.

Other details of the thermal barrier coating for CMAS resistance and low thermal conductivity are set forth in the following description and the accompanying drawings wherein like reference numerals depict like elements.

DETAILED DESCRIPTION

Figure 1:
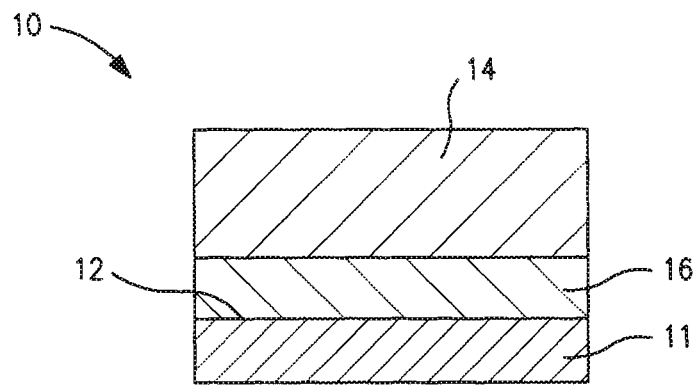
FIG. 1 is a schematic representation of a part having a thermal barrier coating system.

FIG. 1 illustrates a thermal barrier coating system 10 for a turbine engine component or part 11 which comprises a substrate having a surface 12 onto which a thermal barrier coating system 14 has been deposited. The thermal barrier coating 14 may be deposited directly on the surface 12 or, alternatively, may be deposited on top of a bond coat 16.

The part 11 may be formed from a nickel-based alloy, a titanium based alloy, a cobalt-based alloy, a ceramic-matrix composite material, or a ceramic material.

The optional bond coat 16 may be formed from a MCrAlY material, where M may be at least one of nickel, cobalt, and iron. Alternatively, the bond coat may be formed from platinum, an aluminide, or a platinum-aluminide. The bond coat may be deposited using any suitable technique known in the art.

The thermal barrier coating 14 contains neodymia ($Nd_2O_3$), optionally alumina ($Al_2O_3$), and zirconia.

In a first non-limiting embodiment, the thermal barrier coating consists of from 15 mol % to 60 mol % neodymia and the balance zirconia.

In an alternative non-limiting embodiment, the thermal barrier coating consists of from 20 mol % to 35 mol % neodymia and the balance zirconia.

In still another alternative non-limiting embodiment, the thermal barrier coating consists of from 15 mol % to 60 mol % neodymia, from 2.0 mol % to 40 mol % alumina, and the balance zirconia, with said zirconia being present in an amount of at least 40 mol %. The alumina serves as a mechanism for increasing the hardness/toughness of the coating. This will help the thermal barrier coating system described herein to be more resistant to foreign object damage.

In still another alternative non-limiting embodiment, the thermal barrier coating consists of from 20 to 35 mol % neodymia, 2.0 mol % to 40 mol % alumina, and the balance zirconia, with said zirconia being present in an amount of at least 40 mol %.

Figure 2:
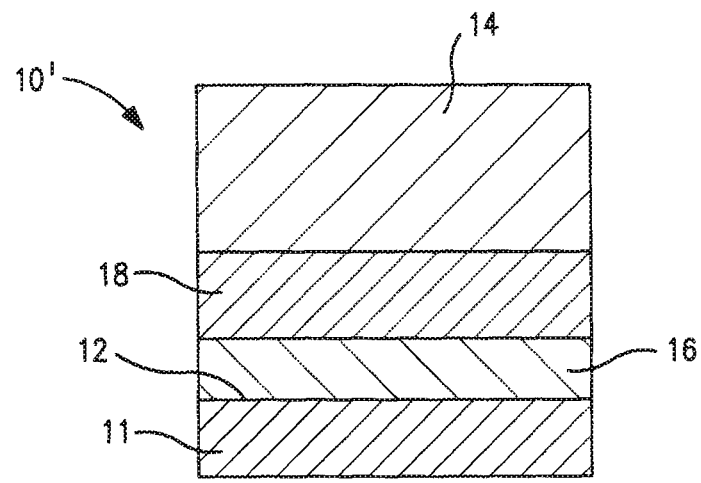
FIG. 2 is a schematic representation of a part having an alternative coating system.

Referring now to FIG. 2, there is shown an alternative coating system 10' for a part 11. The coating system 10' may include a bond coat 16 deposited onto a surface 12 of the part. As before, the bond coat 16 may be optional and, when present, may be formed from a MCrAlY material, where M may be at least one of nickel, cobalt, and iron. Alternatively, the bond coat 16 may be formed from platinum, an aluminide, or a platinum-aluminide. A ceramic coating layer 18 may be deposited on top of the bond coat 16. The ceramic coating layer 18 may be formed from a yttria stabilized zirconia material having from 4 to 25 wt %. In a more preferred embodiment, the deposited layer 18 may consist of yttria in the amount of 6.0 to 9.0 wt % yttria and the balance zirconia A thermal barrier coating layer 14 may be deposited on the ceramic coating layer and may be formed from alumina, neodymia, and zirconia. The thermal barrier coating layer 14 may consist of from 15 mol % to 60 mol % neodymia, from 2.0 mol % to 40 mol % alumina, and the balance zirconia, with said zirconia being present in an amount of at least 40 mol %.

Figure 3:
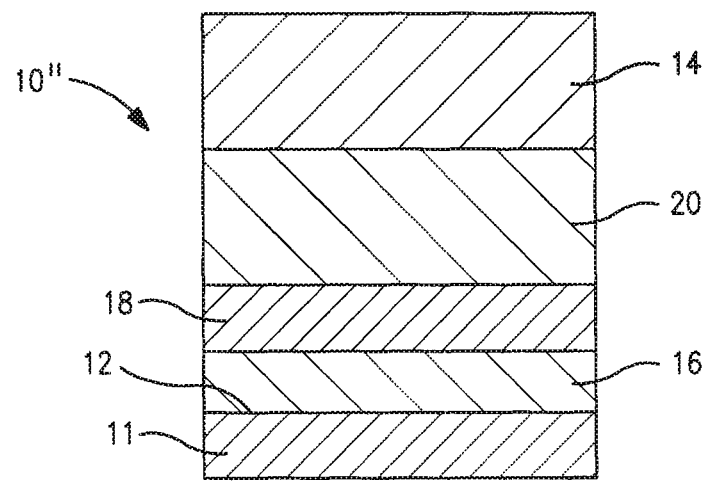
FIG. 3 is a schematic representation of a part having another coating system.

Referring now to FIG. 3, there is shown yet another coating system 10" for a part 11. The coating system 10" is similar to the coating system shown in FIG. 2. It differs from the coating system shown in FIG. 2 by the inclusion of an additional thermal barrier coating layer 20 consisting of neodymia and zirconia. In a first non-limiting embodiment, the additional thermal barrier coating layer 20 may consist of from 15 mol % to 60 mol % neodymia and the balance zirconia. In an alternative non-limiting embodiment, the thermal barrier coating layer 20 may consist of from 20 mol % to 35 mol % neodymia and the balance zirconia.

Figure 4:
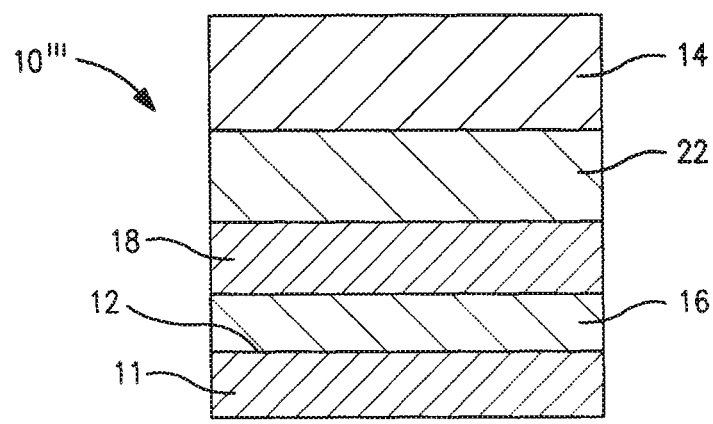
FIG. 4 is a schematic representation of a part having still another coating system.

Referring now to FIG. 4, there is shown yet another coating system 10'" for a part 11. This coating system is also similar to that of FIG. 2. It differs from FIG. 2 by the inclusion of an additional thermal barrier coating layer 22 which consists of an oxide stabilized zirconia coating. The oxide may be an oxide of La, Ce, Pr, Nd, Pm, Sm, Eu, Gd, Tb, Dy, Ho, Er, Tm, Yb, Lu, Mg, Ca, Hf, Sr, and combinations thereof. For example, the layer may contain from 25 to 99.9 wt % gadolinia and may have a thickness in the range of from 0.5 to 50 mils. In a preferred embodiment, gadolinia is present in an amount from 40 to 70 wt %.

The coatings of the present disclosure may be deposited using one or more of the following processes: EB-PVD, CVD, (Air) Plasma Spray, Suspension Plasma Spray, Solution Precursor Plasma Spray, and Sol-Gel Slurry Techniques.

The neodymia thermal barrier coating systems described herein have a lower thermal conductivity than 6-8 wt % yttria stabilized zirconia. The thermal conductivity may be from about 0.5 to 1.5 W/m ° C. Additionally, the coating systems may have a greater resistance to CMAS than 7YSZ and an improved hardness. The density of the coating systems described herein are similar to the density of 7 wt % yttrium stabilized zirconia.

There has been provided in accordance with the present disclosure a thermal barrier coating for CMAS resistance and low thermal conductivity. While the thermal barrier coating has been described in the context of specific embodiments thereof, other unforeseen alternatives, modifications, and variations will become apparent to those skilled in the art having read the foregoing disclosure. Accordingly, it is intended to embrace those alternatives, modifications, and variations as fall within the broad scope of the appended claims.

What is claimed is:

1. A thermal barrier coating system comprising:
    a substrate;
    a bond coat on said substrate;
    a ceramic layer on said bond coat;
    a first thermal barrier coating layer on said ceramic layer, said first thermal barrier coating layer consisting of neodymia, alumina, and the balance zirconia wherein said first thermal barrier coating layer consists of from 15-60 mol % neodymia, 2.0-40 mol % alumina, and the balance zirconia; and
    a second thermal barrier coating layer which consists of an oxide stabilized zirconia and 25 to 99.9 wt % gadolinia.

2. The thermal barrier coating system of claim 1, wherein said first thermal barrier coating layer neodymia is present in an amount from 20 to 35 mol %.

3. The thermal barrier coating system of claim 1, wherein said zirconia is present in an amount greater than 40 mol %.

4. The thermal barrier coating system of claim 1, wherein said substrate is formed from one of a nickel-based alloy, a cobalt-based alloy, a titanium based alloy, a ceramic-matrix composite material and a ceramic material.

* * * * *